United States Patent
Shi et al.

(10) Patent No.: US 11,136,692 B2
(45) Date of Patent: Oct. 5, 2021

(54) PLASTIC SEMICONDUCTOR MATERIAL AND PREPARATION METHOD THEREOF

(71) Applicant: SHANGHAI INSTITUTE OF CERAMICS, CHINESE ACADEMY OF SCIENCES, Shanghai (CN)

(72) Inventors: Xun Shi, Shanghai (CN); Ruiheng Liu, Shanghai (CN); Feng Hao, Shanghai (CN); Tuo Wang, Shanghai (CN)

(73) Assignee: SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 16/967,119

(22) PCT Filed: Feb. 12, 2018

(86) PCT No.: PCT/CN2018/076460
§ 371 (c)(1),
(2) Date: Aug. 3, 2020

(87) PCT Pub. No.: WO2019/153335
PCT Pub. Date: Aug. 15, 2019

(65) Prior Publication Data
US 2020/0362471 A1 Nov. 19, 2020

(30) Foreign Application Priority Data
Feb. 6, 2018 (CN) .......................... 201810117079.4

(51) Int. Cl.
*C30B 29/46* (2006.01)
*C01B 19/00* (2006.01)
(Continued)

(52) U.S. Cl.
CPC ............ *C30B 29/46* (2013.01); *C01B 19/002* (2013.01); *C30B 11/02* (2013.01); *C30B 11/10* (2013.01);
(Continued)

(58) Field of Classification Search
CPC ........................................ C30B 29/46
See application file for complete search history.

(56) References Cited

U.S. PATENT DOCUMENTS

2004/0089882 A1* 5/2004 Aono .................... H01L 49/006
257/212
2005/0238546 A1 10/2005 Holmes et al.
2015/0372212 A1 12/2015 Park et al.

FOREIGN PATENT DOCUMENTS

CN 101786650 A 7/2010
CN 105544971 A 5/2016
(Continued)

OTHER PUBLICATIONS

N. Münzenrieder et al., "InGaZnO TFTs on a flexible membrane transferred to a curved surface with a radius of 2mm," IEEE 2013:165-166, Published Dec. 31, 2013, 2 pages.

(Continued)

*Primary Examiner* — William D Young
(74) *Attorney, Agent, or Firm* — Alleman Hall Creasman & Tuttle LLP (57) ABSTRACT

Disclosed is a plastic semiconductor material and a preparation method thereof. The semiconductor material comprises an argentite-based compound represented by the following formula (I): $Ag_{2-\delta}X_\delta S_{1-\eta}Y_\eta$ (I), in which $0 \leq \delta < 0.5$, $0 \leq \eta < 0.5$, X is at least one of Cu, Au, Fe, Co, Ni, Zn, Ti, or V, and Y is at least one of N, P, As, Sb, Se, Te, O, Br, Cl, I, or F. The material can withstand certain deformations, similar to organic materials, and has excellent semiconduc- (Continued)

tor properties with adjustable electrical properties, thereby enabling the preparation of high-performance flexible semiconductor devices.

8 Claims, 7 Drawing Sheets

(51) Int. Cl.
    *C30B 11/02*     (2006.01)
    *C30B 11/10*     (2006.01)
    *C30B 28/02*     (2006.01)
    *C30B 33/02*     (2006.01)
    *H01L 29/24*     (2006.01)

(52) U.S. Cl.
    CPC .............. *C30B 28/02* (2013.01); *C30B 33/02* (2013.01); *H01L 29/24* (2013.01); *C01P 2002/60* (2013.01); *C01P 2004/03* (2013.01); *C01P 2006/40* (2013.01)

(56) References Cited

FOREIGN PATENT DOCUMENTS

| | | |
|---|---|---|
| CN | 105696080 A | 6/2016 |
| CN | 107235477 A | 10/2017 |

OTHER PUBLICATIONS

Park S K et al., "High mobility solution processed 6,13-bis(triisopropyl-silyle thynyl) pentacene organic thin film transistors," Applied Physics Letters, 2007, 91(6):063514-063514-3, Published online Aug. 9, 2017, 4 pages.

\* cited by examiner

PLASTIC SEMICONDUCTOR MATERIAL AND PREPARATION METHOD THEREOF

TECHNICAL FIELD

The present application relates to a plastic inorganic semiconductor material and a preparation method thereof, which belongs to the field of semiconductor materials.

BACKGROUND

In recent years, with the rapid development of flexible display technology and wearable electronic products, flexible electronic devices have attracted extensive attention, and flexible semiconductor chips, as the core processing devices of flexible electronic products, have increasingly become a research hotspot for various research institutions and companies. Generally speaking, there are two technical routes for preparing flexible semiconductor chips. The first technical route is to use organic semiconductors as a base material. Because organic matter itself has a certain deformability, chip elements made by N-type and P-type regulation of organic matter can also withstand a certain amount of deformation. However, in this route, the improvement in device performance is greatly limited due to the low mobility of the organic semiconductors, meanwhile, organic semiconductor materials are also easily affected by oxygen and humidity, leading to serious problems in the reliability of semiconductor devices (Park S K, Jackson T N, Anthony J E, et al. High mobility solution processed 6,13-bis (triisopropyl-silylethynyl) pentacene organic thin film transistors [J]. Applied Physics Letters, 2007, 91(6):063514-063514-3). The second technical route is to use organic polymers such as PI, etc. as a substrate on which inorganic semiconductors such as Si/Ge thin films, etc. or nanowire semiconductor components are prepared (Münzenrieder N, Salvatore G A, Kinkeldei T, et al. InGaZnO TFTs on a flexible membrane transferred to a curved surface with a radius of 2 mm[J]. 2013:165-166). When the dimensions of inorganic semiconductor materials are within a certain range, they can withstand a certain degree of bending deformation, and thus can be combined with a deformable organic polymer substrate to prepare a semiconductor chip that can bear a certain deformation. This method can maintain the high performance of inorganic semiconductor devices, but it will lead to chip peeling and performance degradation after multiple deformations due to the combination of inorganic and organic materials. At the same time, due to the limitation of technological conditions and fabrication capacities, such inorganic/organic composite flexible semiconductor devices have high fabrication costs and low yields.

SUMMARY

In view of the above-mentioned problems, a purpose of the present application is to provide a material that can not only withstand a certain deformation, similar to organic materials, but also has excellent semiconductor performance with adjustable electrical properties, thereby enabling the preparation of high-performance flexible semiconductor devices.

In a first aspect, the present application provides an inorganic semiconductor material having plastic deformability with adjustable electrical properties, comprising an argentite-based compound represented by the following formula (I):

$Ag_{2-\delta}X_{\delta}S_{1-\eta}Y_{\eta}$     (I), in which, $0 \leq \delta < 0.5$, and $0 \leq \eta < 0.5$;

X is at least one of Cu, Au, Fe, Co, Ni, Zn, Ti, and V; and

Y is at least one of N, P, As, Sb, Se, Te, O, Br, Cl, I, and F.

In addition to semiconductor electrical properties with adjustable electrical properties, the inorganic semiconductor material of the present application has great plastic deformability under compression, tension, and bending stress, and thus can meet the requirements of flexible electronic devices for deformable semiconductor materials, and can provide a novel solution for the new generation of flexible semiconductor devices.

A band gap of the inorganic semiconductor material may be adjusted within the range of 0.5 to 1.5 eV, and an electrical conductivity thereof may be adjusted within the range of 0.001 to 250,000 S/m.

The inorganic semiconductor material may withstand a tensile deformation of 3% or more, a bending deformation of 13% or more, and a compression deformation of 30% or more.

Preferably, $0 \leq \delta < 0.05$, and $0 \leq \eta < 0.05$.

Preferably, $0.1 \leq \delta < 0.5$, and $0.1 \leq \eta < 0.5$.

The semiconductor material may be a single crystal.

Alternatively, the semiconductor material may be a polycrystal.

The grain size of the polycrystal may range from 1 μm to 5 mm and the density thereof may be 95% or more.

In a second aspect, the present application provides a preparation method of the inorganic semiconductor material mentioned above, comprising the steps of:

keeping raw materials according to the stoichiometric ratio of formula (I) at 850 to 1,200° C. for 1 to 20 hours under an inert gas atmosphere or in vacuum to form a uniformly mixed melt of the raw materials and then cooling the melt to give a block solid; and subjecting the block solid to a powder sintering process to obtain a polycrystalline material or to a crystal growth process by a Bridgman-Stockbarge method to obtain a single-crystalline material.

The present application has a simple process, is easy to control, and has a good industrialization prospect.

Preferably, the preparation method further comprises an annealing step after cooling. Preferably, the annealing temperature is 400 to 650° C. and the annealing time is 1 to 300 hours.

Preferably, the sintering is spark plasma sintering or hot-pressed sintering. Preferably, the sintering temperature is 100 to 400° C., the pressure is 10 to 100 MPa, and the sintering time is 5 to 120 minutes.

Preferably, the crystal growth process by Bridgman-Stockbarge method comprises the steps of:

placing a crucible filled with the block solid in a constant temperature zone of a crystal growing furnace, wherein the temperature of the constant temperature zone ranges from 830° C. to 950° C.; and after the block solid has completely melted, lowering the crucible at a lowering rate of 0.1 mm/h to 10 mm/h, and controlling the temperature gradient to be 1° C./cm to 100° C./cm.

The plastic semiconductor material of the present application can not only withstand a certain deformation, similar to organic materials, but also has excellent semiconductor performance with adjustable electrical properties, thereby enabling the preparation of high-performance flexible semiconductor devices.

DETAILED DESCRIPTION

The present invention will be further described with the following examples below. It should be understood that the following examples are only used for explaining this invention, and do not limit this invention.

In view of the shortage of existing semiconductor materials, the inventors of the present application have developed a novel inorganic semiconductor material with plastic deformability and a preparation method thereof after extensive and in-depth research, thus improving the deformation resistance and fragile characteristics of semiconductor materials.

The present disclosure provides a semiconductor material, the host in which is an argentite semiconductor compound. The semiconductor material comprises an argentite-based compound represented by the following formula (I):

$$Ag_{2-\delta}X_\delta S_{1-\eta}Y_\eta \qquad (I).$$

In the formula, X may be one or more selected from the group consisting of Cu, Au, Fe, Co, Ni, Zn, Ti, and V. Y may be one or more selected from the group consisting of N, P, As, Sb, Se, Te, O, Br, Cl, I, and F. The band gap, electrical conductivity and other properties of the material may be adjusted by doping of X and Y.

The inventors of the present application have discovered for the first time that $Ag_2S$ has a plastic property, and such a unique deformable plastic property, together with its adjustable electrical property over a wide range, allow $Ag_2S$ to be used to prepare a variety of deformable semiconductor devices.

Preferably, X may be one or more selected from the group consisting of Cu, Zn, and Ni.

Preferably, Y may be one or more selected from the group consisting of Se, Te, Cl, Br, and I.

In the formula, $0 \leq \delta < 0.5$. Preferably, $0 < \delta < 0.5$. In a preferred example, $0 \leq \delta < 0.05$. In another preferred example, $0.1 \leq \delta < 0.5$.

In the formula, $0 \leq \eta < 0.5$. Preferably, $0 < \eta < 0.5$. In a preferred example, $0 \leq \eta < 0.05$. In another preferred example, $0.1 \leq \eta < 0.5$.

In a preferred example, $0 \leq \delta < 0.05$, and $0 \leq \eta < 0.05$.

In another preferred example, $\delta = 0$, and $\eta = 0$. Namely, formula (I) is $Ag_2S$.

In another preferred example, $0.1 \leq \delta < 0.5$, and $0.1 \leq \eta < 0.5$.

In another preferred example, $\delta = 0.2$, and $\eta = 0.1$. Namely, formula (I) is $Ag_{1.8}Cu_{0.2}S_{0.9}Se_{0.1}$.

The crystal structure of the semiconductor material presents a lamellar-like structure. In other words, doping atoms X and Y can be evenly distributed in the corresponding lattice locations, without affecting the lamellar-like structure of the argentite itself.

The semiconductor material may be a single-crystalline material (also referred to as "single crystal"). The so-called single-crystalline material means that the whole material is composed of a single grain.

Alternatively, the semiconductor material may be a polycrystalline material (also referred to as "polycrystal"). The so-called polycrystalline material means that the whole material is composed of many small crystals arranged disorderly. The grain size of the polycrystalline material ranges from 1 μm to 5 mm. In addition, the density of the polycrystalline material may be 95% or more, even 98% or more. The polycrystalline material has a simpler preparation process, while maintaining good plasticity and other properties.

The semiconductor material may be an N-type doped semiconductor material or a P-type doped semiconductor material.

In a preferred example, the content of other impurities in the semiconductor material is 1 at % or less.

The band gap of the semiconductor material may be adjusted within the range of 0.5 to 1.5 eV, preferably within the range of 0.5 to 1.2 eV.

The electrical conductivity of the semiconductor material may be adjusted within the range of 0.001 to 250,000 S/m, preferably within the range of 0.01 to 1,000 S/m, more preferably within the range of 1 to 1,000 S/m.

The semiconductor material has a good plasticity. For example, it can withstand a tensile deformation of 3% or more, a bending deformation of 13% or more, even 20% or more, and a compression deformation of 30% or more.

The semiconductor disclosed herein can withstand certain deformation, similar to organic materials, and has excellent semiconductor performance with adjustable electrical properties, thereby enabling the preparation of high-performance flexible semiconductor devices.

Hereinafter, the preparation method of the semiconductor material will be described exemplarily.

Embodiment 1

Figure 7:
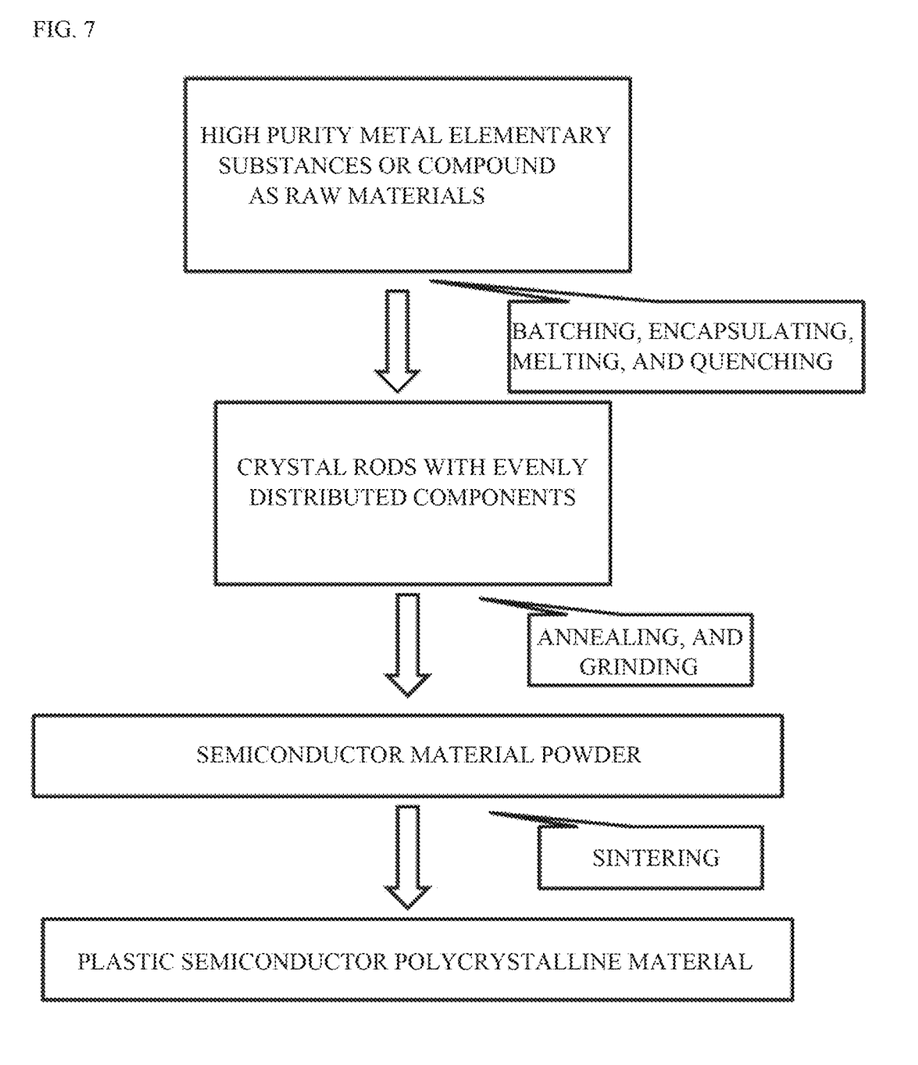
FIG. 7 is a process flow diagram of preparing a polycrystalline plastic semiconductor material in an example.

FIG. 7 shows a process flow diagram of preparing a polycrystalline plastic semiconductor material in Embodiment 1.

As shown in FIG. 7, in the first place, raw materials are made into a block solid (such as a crystal rod) with evenly distributed components through a solid phase reaction.

The raw materials used may be elementary substances of the constituent elements of formula (I), or compound composed of the elements. The raw materials are preferably high-purity materials, for example, have a purity of 99% or more. There is no specific limit to the form of raw materials, which may be blocky, powdery, or flaky. The ratio between raw materials may be in accordance with the stoichiometric ratio of formula (I).

The raw materials are mixed and melted to give a molten mixture. In one example, the raw materials are mixed and then heated to 850 to 1,200° C. to melt. The raw materials can be kept at this temperature for 1 to 20 hours. The heating rate may be 0.5 to 3° C./min.

In one example, the raw materials are encapsulated and melted in a sealed container. The sealed container may be a quartz tube. The sealed container may be a common tube or a crystal growing tube with a pointed tip at its top. When a quartz tube is used as the sealing container, a uniform carbon film can be coated on the inner wall of the quartz tube, or the raw materials can be placed into a graphite crucible and then encapsulated in the quartz tube, so as to prevent the reaction between the raw materials and the quartz tube.

The melting may be performed in an inert atmosphere or in vacuum. The vacuum degree may be 0.1 to 40,000 Pa, preferably 0.1 to 1,000 Pa.

The obtained molten mixture is cooled to form a block solid. The cooling method may be quenching in quenching medium, or slow cooling. The quenching medium may be air, water, saturated brine, oil, or liquid nitrogen.

After cooling, the block solid may be further annealed to make the doping components more uniform and improve the crystallinity of the material. The annealing temperature may be 400 to 650° C., preferably 550 to 650° C. The annealing time may be 1 to 300 hours, preferably 200 to 300 hours.

The block solid is ground into powder. The size of the powder may be 1 to 100 μm.

The powder is sintered to give a polycrystalline material. The sintering method may be pressure sintering, such as spark plasma sintering or hot-pressed sintering. The sintering temperature may be 100 to 400° C., preferably 200 to 300° C. The pressure applied may be 10 to 100 MPa, preferably 30 to 60 MPa. The sintering time may be 5 to 120 minutes, preferably 5 to 30 minutes.

Embodiment 2

Figure 8:
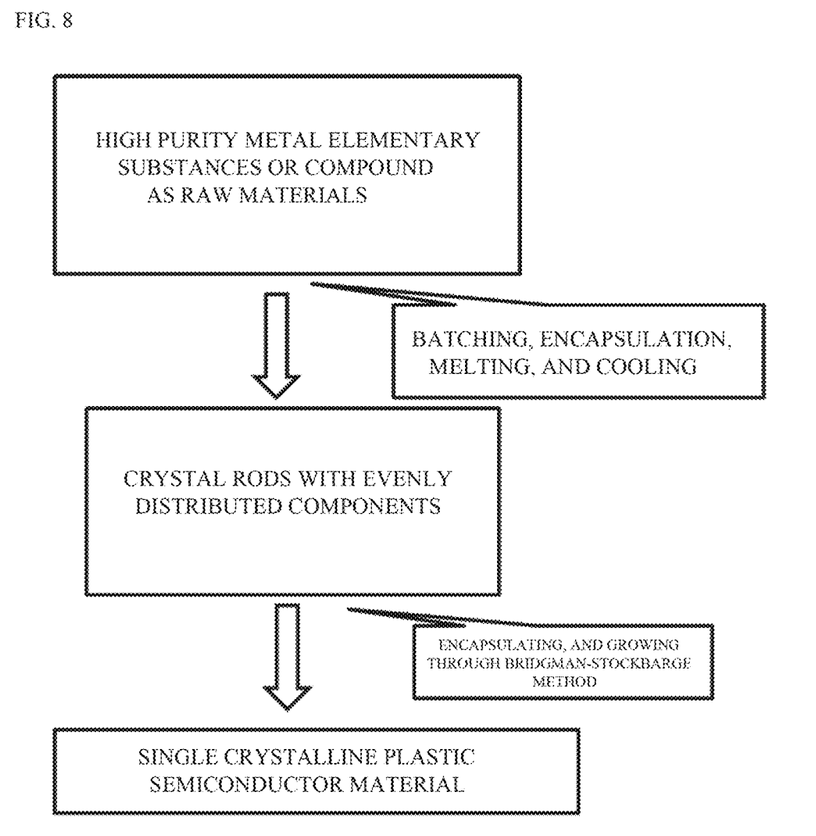
FIG. 8 is a process flow diagram of preparing a single-crystalline plastic semiconductor material in an example.

FIG. 8 shows a process flow diagram of preparing a single-crystalline plastic semiconductor material in Embodiment 2.

As shown in FIG. 8, in the first place, raw materials are made into a block solid (such as a crystal rod) with evenly distributed components through a solid phase reaction. This step can be taken in the same way as Embodiment 1 and will not be repeated here.

Then, the block solid is made into a single-crystalline material. In one example, the block solid is subjected to a crystal growth process by a Bridgman-Stockbarger method, to give a single-crystalline semiconductor material.

Figure 9:
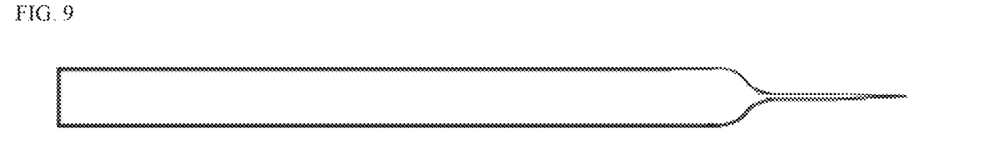
FIG. 9 is a structural sketch of a crystal growing tube with a pointed tip at its top.

The obtained block solid is placed in a crystal growing tube with a pointed tip at its top (see FIG. 9). The crystal growing tube, for example, may be a quartz tube. In addition, to simplify the process, a crystal growing tube with a pointed tip at its top can be used as a sealed container in the preparation of the block solid (i.e., a crystal growing tube with a pointed tip is used before the initial melting). This eliminates the need to take out the block solid and place it in a crystal growing tube.

A crystal growing tube filled with the block solid is placed in a constant temperature zone of a crystal growing furnace. The temperature of the constant temperature zone may range from 830° C. to 950° C. The temperature gradient of the constant temperature zone may be 1° C./cm to 100° C./cm, preferably 1° C./cm to 5° C./cm. The crucible lowering rate may be 0.1 mm/h to 10 mm/h, preferably 0.1 mm/h to 1 mm/h.

The size of the obtained single-crystalline semiconductor material may be 1 mm to 50 mm in diameter and 5 mm to 50 mm in height.

The disclosed semiconductor material can be used to prepare flexible semiconductor devices, such as flexible semiconductor chips, etc. The disclosed preparation method is controllable and suitable for batch industrial production.

Hereinafter, the present invention will be better described with the following representative examples. It should be understood that the following examples are used to explain this invention and do not limit the scope of this invention. Any non-essential improvements and modifications made by a person skilled in the art based on this invention all fall into the protection scope of this invention. The specific parameters below are only exemplary, and a person skilled in the art can choose proper values within an appropriate range according to the description of this article, and are not restricted to the specific values cited below.

Example 1

$Ag_{1.8}Cu_{0.2}S_{0.9}Se_{0.1}$ polycrystalline block material

Elemental substances Ag, Cu, S and Se, as raw materials, were mixed in a glove box in accordance with a molar ratio of 1.8:0.2:0.9:0.1. The raw materials were encapsulated into a quartz tube with a carbon film deposited on the inner wall. The quartz tube was sealed with argon plasma flame while being vacuumized, and was filled with a small amount of Ar gas as a protective atmosphere. The mixed raw materials were heated at a rate of 3° C./min to 900° C., and melted thereat for 12 hours. Quenching was carried out after the melting, and the quenching medium is brine. A crystal rod obtained by quenching, together with the quartz tube, were annealed at 500° C. for 100 hours. The crystal rod was grinded into fine powder, and subjected to spark plasma sintering to give an $Ag_{1.8}Cu_{0.2}S_{0.9}Se_{0.1}$ polycrystalline block material. The sintering temperature was 400° C., the holding time was 2 minutes, and the pressure was 30 MPa.

Figure 1:
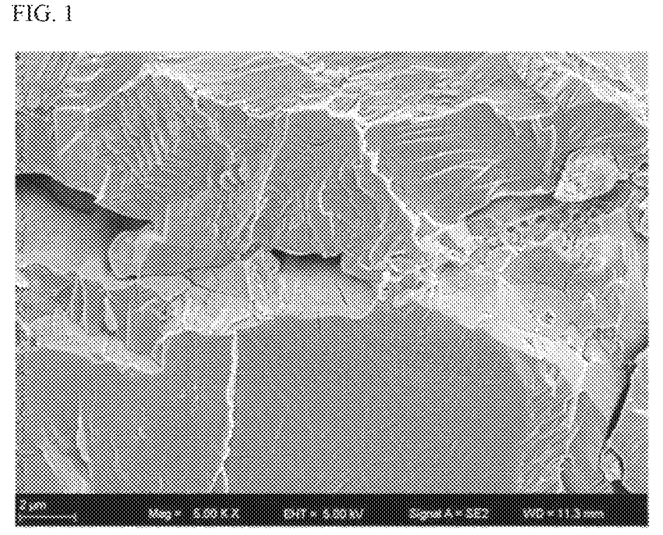
FIG. 1 is a cross section FESEM (field emission scanning electron microscopy) photograph of $Ag_{2-\delta}X_\delta S_{1-\eta}Y_\eta$ material obtained from example 1, wherein the grain size ranges from 5 to 10 μm.
Figure 3:
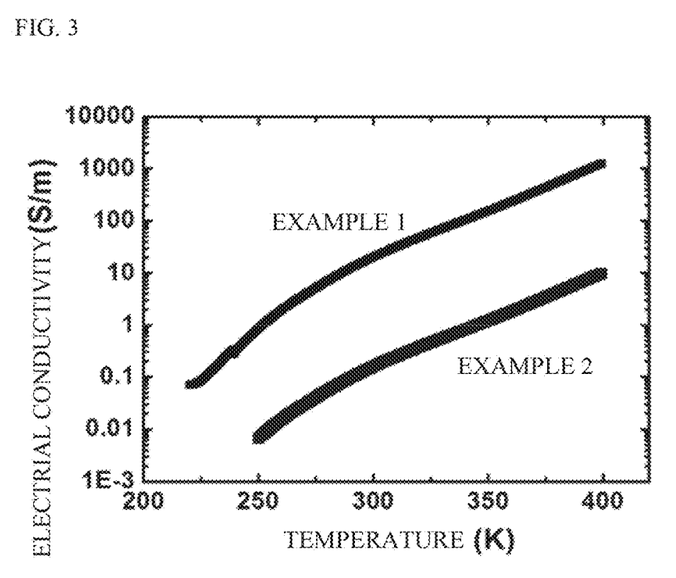
FIG. 3 is a diagram showing the electrical conductivity of semiconductor materials in examples 1 and 2 as a function of temperature. As the temperature rises, the electrical conductivity increases significantly, showing typical semiconductor characteristics; moreover, with the increase of doping components, the electrical conductivity of $Ag_{1.8}Cu_{0.2}S_{0.9}Se_{0.1}$ material was nearly two orders of magnitude higher than that of the base material.
Figure 4:
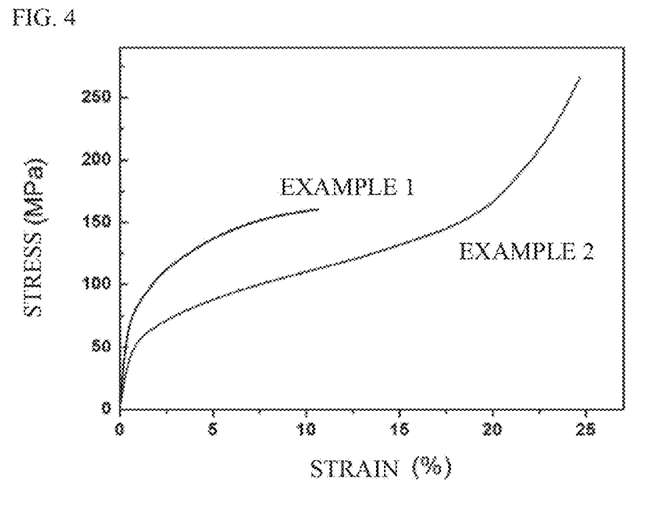
FIG. 4 is stress-strain curves of semiconductor materials of examples 1 and 2 under a bending test.
Figure 5:
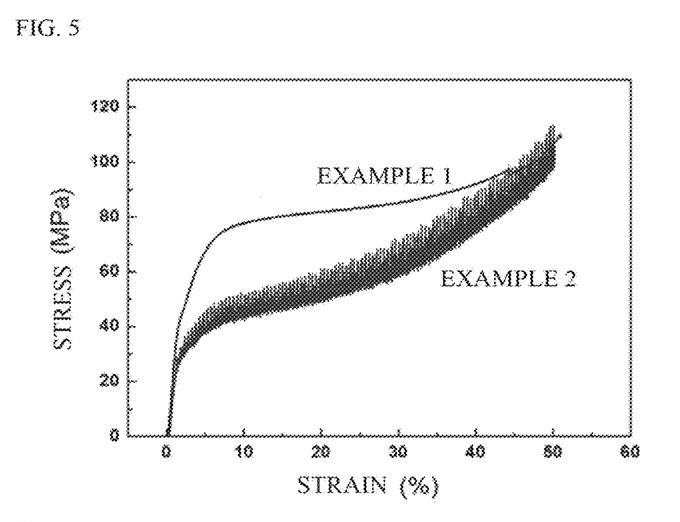
FIG. 5 is stress-strain curves of semiconductor materials of examples 1 and 2 under a compression test.
Figure 6:
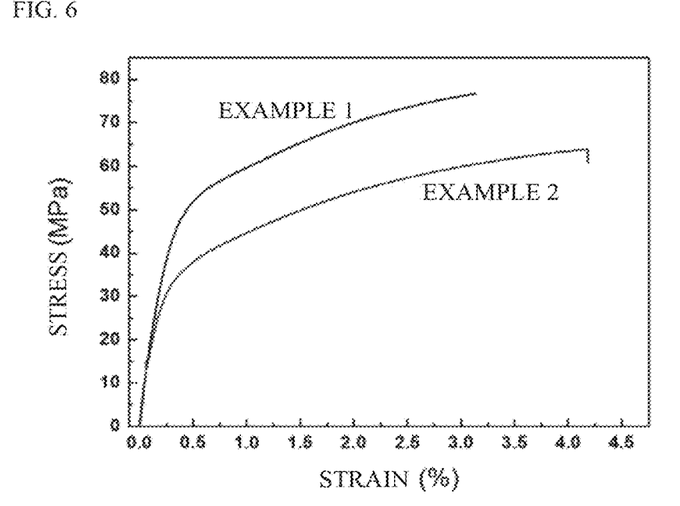
FIG. 6 is stress-strain curves of semiconductor materials of examples 1 and 2 under a tensile test.

A test by a drainage method showed that the density of the $Ag_{1.8}Cu_{0.2}S_{0.9}Se_{0.1}$ reached 99.2%. FIG. 1 shows a cross section FESEM (field emission scanning electron microscopy) photograph of $Ag_{2-\delta}X_\delta S_{1-\eta}Y_\eta$ material obtained from example 1, and it can be seen that the grain size is 5 to 10 μm. A spectral absorption test showed that the band gap was 0.73 eV (see FIG. 2). A test by a four-probe method showed that the electrical conductivity at room temperature was 20 S/m (see FIG. 3). Samples with a size of 4 mm×4 mm×30 mm were tested using a three-point bending method, and the bending stress-strain curve showed that the maximum bending deformation reached 15%. The size of samples for a compression deformation test at room temperature was 20 mm in diameter×20 mm in height, and the maximum compression deformation reached 40%. The samples for an extension test were dumbbell-shaped, and had a neck size of 5 mm in diameter×30 mm, and the maximum elongation reached 3.2% (see FIG. 4 to FIG. 6).

Example 2

Ag$_2$S semiconductor material crystal ingot

Figure 10:
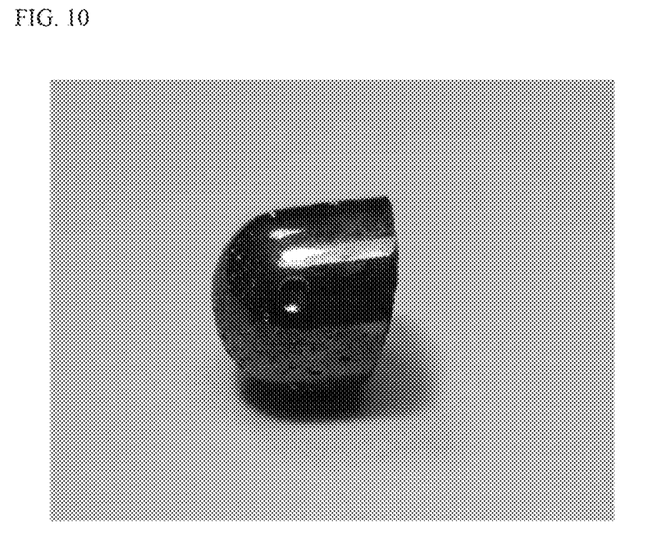
FIG. 10 is a photograph of $Ag_2S$ semiconductor material crystal ingot obtained from example 2.

Elementary substances Ag and S, as raw materials, were mixed in a glove box in accordance with a molar ratio of 2:1. The raw materials were encapsulated into a quartz tube with a pointed tip at the bottom. The quartz tube was sealed with argon plasma flame while being vacuumized, and was filled with a small amount of Ar gas as the protective atmosphere. The mixed raw materials were melted at 1,000° C. for 12 hours and then cooled. The quartz tube was placed into a crystal lowering furnace for crystal growth, wherein the temperature of the constant temperature zone was 830° C., the temperature gradient was 2° C./cm, and the crucible lowering rate was 1 mm/h. An Ag$_2$S semiconductor material crystal ingot was obtained, the photograph of which is shown in FIG. 10.

Figure 2:
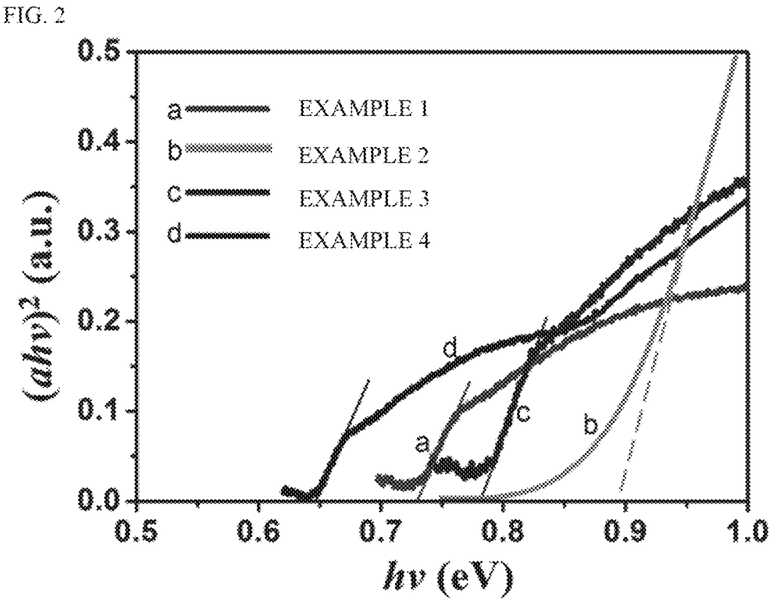
FIG. 2 is spectroscopic data of $Ag_{2-\delta}X_\delta S_{1-\eta}Y_\eta$ materials obtained from examples 1 to 4.

A spectral absorption test showed that the band gap was 0.90 eV (see FIG. 2). A test showed that the electrical conductivity of the material obtained from example 2 at room temperature was 0.15 S/m. A test of mechanical properties at room temperature showed that the material had a good plasticity. The maximum bending deformation reached 20%, the compression deformation reached 50%, and the tensile elongation reached 4.2% (see FIG. 4 to FIG. 6).

Example 3

Ag$_{1.9}$Zn$_{0.1}$S$_{0.85}$I$_{0.15}$

Elementary substances Ag, Zn, S and I, as raw materials, were mixed in a glove box in accordance with a molar ratio of 1.9:0.1:0.85:0.15. The raw materials were encapsulated into a quartz tube with a carbon film deposited on the inner wall. The quartz tube was sealed with argon plasma flame while being vacuumized, and was filled with a small amount of Ar gas as the protective atmosphere. The mixed raw materials were heated at a rate of 0.5° C./min to 1,000° C., and melted thereat for 12 hours. Quenching was carried out after the melting, and the quenching medium is brine. A crystal rod obtained by quenching, together with the quartz tube, were annealed at 450° C. for 200 hours. The crystal rod was grinded into fine powder, and subjected to spark plasma sintering to give an Ag$_{1.9}$Zn$_{0.1}$S$_{0.85}$I$_{0.15}$ polycrystalline block material. The sintering temperature was 380° C., the holding time was 5 minutes, and the pressure was 40 MPa.

Figure 11:
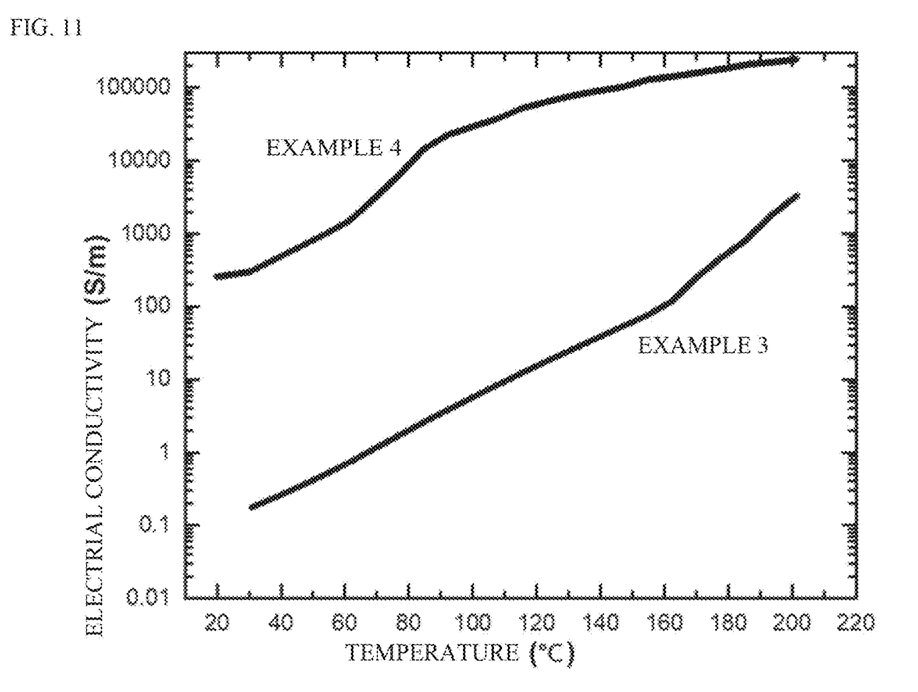
FIG. 11 is a diagram showing the electrical conductivity of samples obtained from examples 3 and 4 as a function of temperature.
Figure 12:
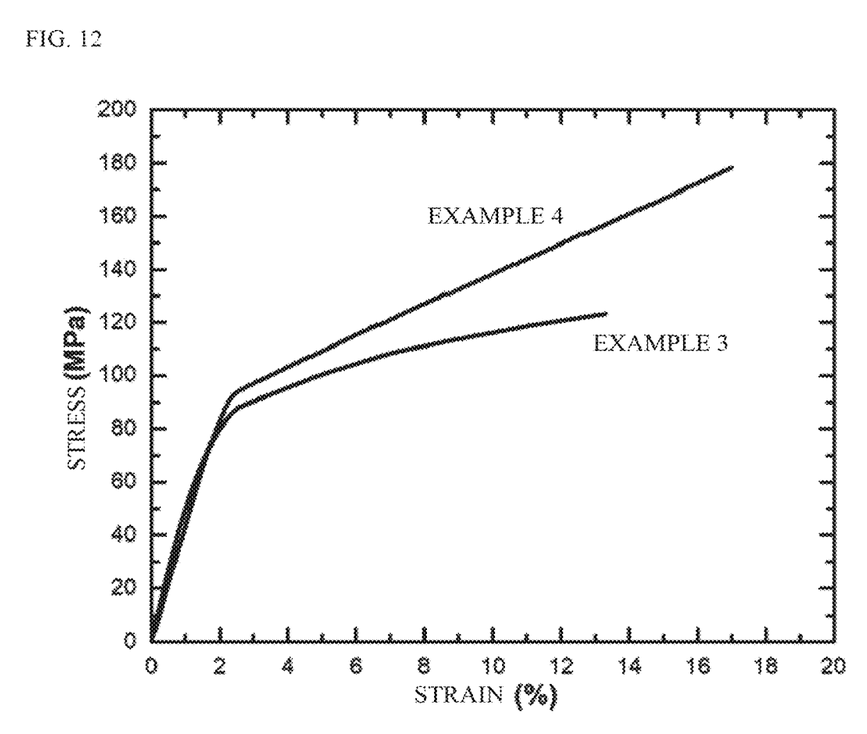
FIG. 12 is stress-strain curves of samples obtained from examples 3 and 4 under a bending test.

A spectral absorption test showed that the band gap was 0.78 eV (see FIG. 2). A test by a drainage method showed that the density of the Ag$_{1.9}$Zn$_{0.1}$S$_{0.85}$I$_{0.15}$ reached 98.5%. A test by a four-probe method showed that the electrical conductivity at room temperature was 0.1 S/m (see FIG. 11). Samples with a size of 4 mm×4 mm×30 mm were tested using a three-point bending method, and the bending stress-strain curve showed that the maximum bending deformation reached 13% (see FIG. 12).

Example 4

Ag$_{1.85}$Ni$_{0.15}$S$_{0.6}$Te$_{0.4}$

Elementary substances Ag, Ni, S and Te, as raw materials, were mixed in a glove box in accordance with a molar ratio of 1.85:0.15:0.6:0.4. The raw materials were encapsulated into a quartz tube with a carbon film deposited on the inner wall. The quartz tube was sealed with argon plasma flame while being vacuumized, and was filled with a small amount of Ar gas as the protective atmosphere. The mixed raw materials were heated at a rate of 3° C./min to 850° C., and melted thereat for 20 hours. Slow cooling was carried out after the melting. A crystal rod obtained by slow cooling, together with the quartz tube, were annealed at 550° C. for 20 hours. The crystal rod was grinded into fine powder, and subjected to hot-pressed sintering to give an Ag$_{1.85}$Ni$_{0.15}$S$_{0.6}$Te$_{0.4}$ polycrystalline block material. The sintering temperature was 300° C., the heating rate was 10° C./min, the holding time was 30 minutes, and the pressure was 30 MPa.

A spectral absorption test showed that the band gap was 0.65 eV (see FIG. 2). A test by a drainage method showed that the density of the Ag$_{1.85}$Ni$_{0.15}$S$_{0.6}$Te$_{0.4}$ reached 99.6%. A test by a four-probe method showed that the electrical conductivity at room temperature was 250 S/m and the electrical conductivity at 200° C. was 201,050 S/m (see FIG. 11). Samples with a size of 4 mm×4 mm×30 mm were tested using a three-point bending method, and the bending stress-strain curve showed that the maximum bending deformation reached 17% (see FIG. 12).

The invention claimed is:

1. An inorganic semiconductor material having plastic deformability, comprising an argentite-based compound represented by the following formula (I):

$$Ag_{2-\delta}X_\delta S_{1-\eta}Y_\eta \quad (I),$$

in which 0.1≤δ<0.5, and 0.1≤η<0.5,

X is at least one of Cu, Au, Fe, Co, Ni, Zn, Ti, and V, and

Y is at least one of N, P, As, Sb, Se, Te, O, Br, Cl, I, and F, wherein the inorganic semiconductor material can withstand a tensile deformation of 3% or more, a bending deformation of 13% or more, and a compression deformation of 30% or more.

2. The inorganic semiconductor material of claim 1, wherein a band gap of the inorganic semiconductor material can be adjusted within the range of 0.5 to 1.5 eV, and an electrical conductivity can be adjusted within the range of 0.001 to 250,000 S/m.

3. The inorganic semiconductor material of claim 1, wherein the semiconductor material is a polycrystal.

4. A preparing method of the inorganic semiconductor material of claim 1, comprising the steps of:

keeping raw materials according to the stoichiometric ratio of formula (I) at 850 to 1,200° C. for 1 to 20 hours under an inert gas atmosphere or in vacuum to form a uniformly mixed melt of the raw materials and then cooling the melt to give a block solid; and subjecting the block solid to a powder sintering process to obtain the inorganic semiconductor material represented by formula (I), the inorganic semiconductor material being a polycrystalline material.

5. The preparing method of claim 4, wherein the preparing method further comprises an annealing step after cooling.

6. The preparing method of claim 4, wherein the sintering is spark plasma sintering or hot-pressed sintering.

7. The preparing method of claim 5, wherein the annealing temperature is 400 to 650° C. and the annealing time is 1 to 300 hours.

8. The preparing method of claim 6, wherein the sintering temperature is 100 to 400° C., the pressure is 10 to 100 MPa, and the sintering time is 5 to 120 minutes.

* * * * *